United States Patent
Zhu et al.

(10) Patent No.: US 11,121,072 B1
(45) Date of Patent: Sep. 14, 2021

(54) SEMICONDUCTOR DEVICE WITH ISOLATION STRUCTURE

(71) Applicant: NXP USA, Inc., Austin, TX (US)

(72) Inventors: Ning Zhu, Chandler, AZ (US); Ibrahim Khalil, Gilbert, AZ (US); Jeffrey Spencer Roberts, Tempe, AZ (US); Damon G. Holmes, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/820,491

(22) Filed: Mar. 16, 2020

(51) Int. Cl.
*H01L 23/522* (2006.01)
*H01L 23/00* (2006.01)

(52) U.S. Cl.
CPC ...... *H01L 23/5221* (2013.01); *H01L 23/5226* (2013.01); *H01L 24/45* (2013.01); *H01L 24/85* (2013.01)

(58) Field of Classification Search
CPC . H01L 23/5221; H01L 23/5226; H01L 24/45; H01L 24/85

USPC .......................................................... 257/758
See application file for complete search history.

(56) References Cited

U.S. PATENT DOCUMENTS

| | | | |
|---|---|---|---|
| 9,589,927 | B2 | 3/2017 | Szymanowski et al. |
| 9,607,953 | B1 | 3/2017 | Li et al. |
| 9,673,164 | B2 | 6/2017 | Watts et al. |
| 9,685,351 | B2 | 6/2017 | Higgins, III |
| 10,110,170 | B2 | 10/2018 | Szymanowski et al. |
| 2020/0343214 | A1* | 10/2020 | Seki ........................ H01L 24/49 |

* cited by examiner

*Primary Examiner* — Tu-Tu V Ho

(57) ABSTRACT

A semiconductor device includes a transistor die having top and bottom die surfaces, an electrically conductive structure, and input and output pads formed at the top die surface. An isolation structure is interposed between the input and output pads of the transistor die. The isolation structure extends above the top die surface, is coupled to the conductive structure, and is connected to a common return path of the transistor die. The isolation structure may be formed from one or more bondwires and is configured to reduce mutual coupling between input and output interconnects of the semiconductor device.

17 Claims, 7 Drawing Sheets

20

SEMICONDUCTOR DEVICE WITH ISOLATION STRUCTURE

TECHNICAL FIELD OF THE INVENTION

The present invention relates generally to semiconductor devices. More specifically, the present invention relates to a semiconductor device incorporating an isolation structure for reducing mutual coupling between input and output interconnects.

BACKGROUND OF THE INVENTION

Wireless communication systems often employ power amplifiers for increasing the power of a signal. In a wireless communication system, a power amplifier is usually the last amplifier in a transmission chain (the output stage) and it is the amplifier stage that typically demands the most attention to power efficiency. High gain, high linearity, stability, and a high level of power-added efficiency (i.e., the ratio of the difference between the output power and the input power to DC power) are characteristics of an ideal amplifier.

In some typical amplifier configurations, power amplifiers are implemented using multi-finger field effect transistors, and amplified signals produced by each transistor finger are combined at an output bond pad. Bondwire arrays are typically used to establish signal paths to input pads on a transistor and to establish signal paths from output pads on the transistor. At higher frequencies (e.g., in the gigahertz (GHz) range), mutual coupling (e.g., electromagnetic interaction) can occur between the bondwire arrays for the input and output interconnections. This mutual coupling between input and output bondwires is dominated by the wire shapes and is difficult to consistently manipulate. Unfortunately, the mutual coupling between input and output bondwires may result in decreased gain of such semiconductor devices. Accordingly, what is needed is a semiconductor device design that is capable of improved gain without impairing other performance characteristics, especially at higher frequencies.

SUMMARY

Aspects of the disclosure are defined in the accompanying claims.

In a first aspect, there is provided a semiconductor device comprising a transistor die having a top die surface and a bottom die surface, an electrically conductive structure, and input and output pads formed at the top die surface; and an isolation structure interposed between the input and output pads of the transistor die, the isolation structure extending above the top die surface of the transistor die, the isolation structure being coupled to the conductive structure, and the isolation structure being connected to a common return path of the transistor die.

In a second aspect, there is provided a semiconductor device comprising an electrically conductive substrate; an input device; an output device; a transistor die interposed between the input and output devices, the transistor die having a top die surface and a bottom die surface, the bottom die surface being coupled to the electrically conductive substrate, a conductive structure, and input and output pads formed at the top die surface; a first interconnect coupling the input pad of the transistor die with the input device; a second interconnect coupling the output pad of the transistor die with the output device; and an isolation structure interposed between the input and output pads of the transistor die, the isolation structure comprising at least one bondwire, the bondwire extending above the top die surface of the transistor die, the bondwire being coupled to the conductive structure, and the bondwire being connected to a common return path of the transistor die.

In a third aspect, there is provided a method of fabricating a semiconductor device comprising coupling a bottom die surface of a transistor die to an electrically conductive device substrate, wherein the transistor die includes a top die surface and a bottom die surface, an electrically conductive structure, and input and output pads formed at the top die surface; coupling an isolation structure to the electrically conductive structure such that the isolation structure is interposed between the input and output pads of the transistor die, and the isolation structure extends above the top die surface of the transistor die; and connecting the isolation structure to a common return path of the transistor die

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
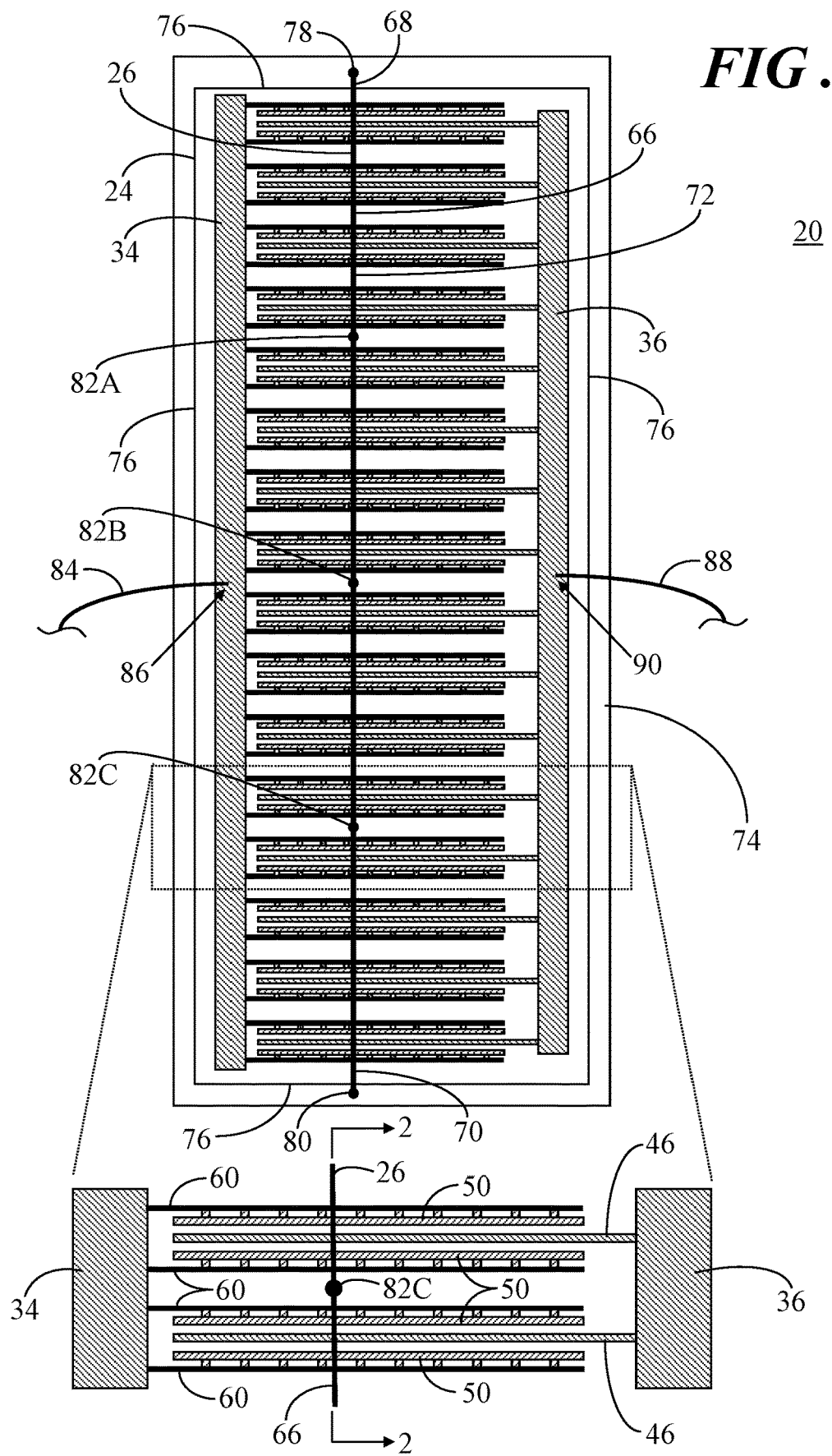
FIG. 1 shows a top schematic view of a semiconductor device, in accordance with an example embodiment.

In overview, embodiments disclosed herein entail a semiconductor device that incorporates an isolation structure to reduce mutual coupling between inputs and outputs of the semiconductor device. The isolation structure can take the form of one or a plurality of bondwires interposed between the input pads and the output pads of a transistor die of the semiconductor device. The bondwires are connected to a common return path (e.g., ground) of the transistor die. The bondwires may be coupled to a conductive structure extending through the transistor die and/or to a flange or system substrate of the semiconductor device. Such a configuration may yield significant signal isolation between the inputs and outputs of the transistor die to thereby improve gain without impairing other performance characteristics of the semiconductor device, especially at higher frequencies.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

The use of relational terms, if any, such as "first," "second," "third," "fourth," and the like are used solely to distinguish one from another entity or action without necessarily requiring or implying any actual such relationship or order between such entities or actions. It is to be understood that the terms so used are interchangeable under appropriate circumstances such that the example embodiments described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all used of the apparatus being described.

Furthermore, the terms "comprise," "include," "have," and any variations thereof, are intended to cover non-exclusive inclusions, such that a process, method, article, or apparatus that comprises a list of elements if not necessarily limited to those elements, but may include other elements not expressly listed or inherent to such process, method, article, or apparatus. The terms "coupled," "connected," and any variations thereof as used herein are defined as directly or indirectly connected in an electrical or non-electrical manner. The terms "substantial" and "substantially" herein mean sufficient to accomplish the state purpose in a practical manner that minor imperfections, if any, are not significant for the stated purpose.

Some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching may be utilized in the illustrations, the different elements within the structural layers may be formed out of the same material.

Figure 2:
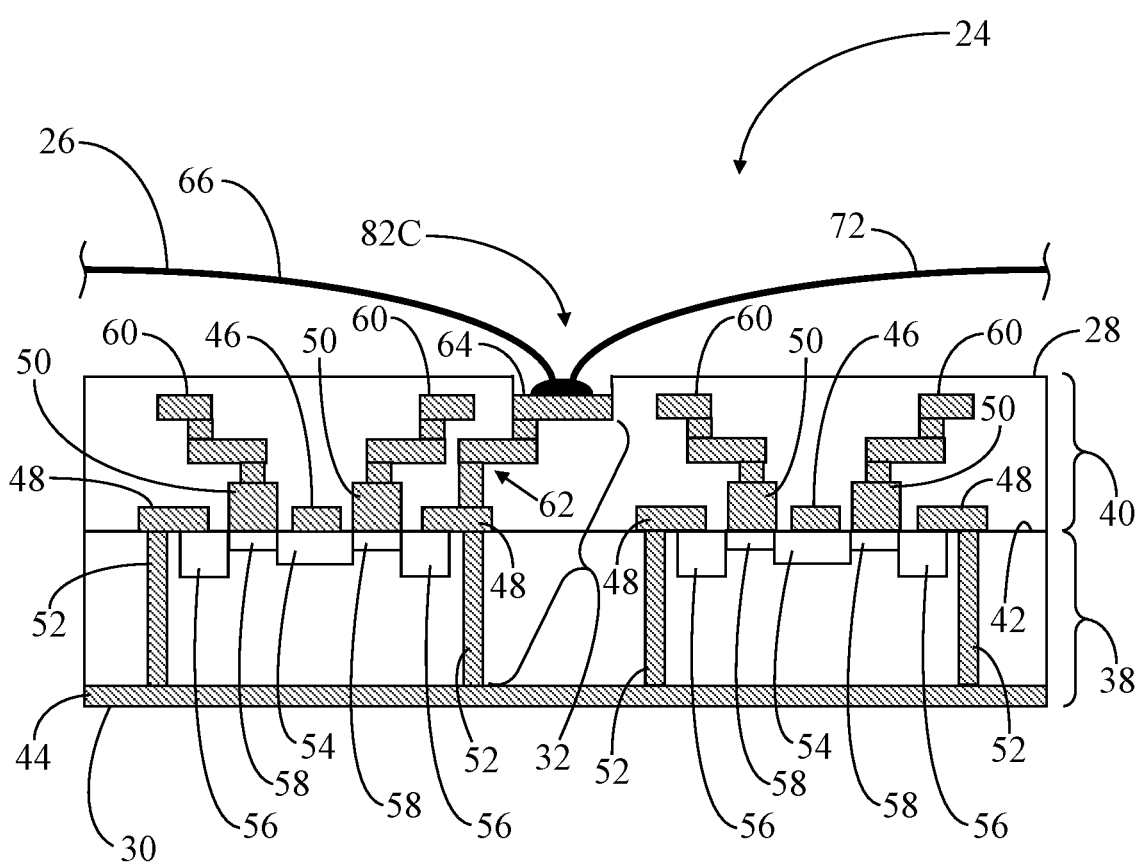
FIG. 2 shows a side view of the semiconductor device along section lines 2-2 of FIG. 1.

Referring concurrently to FIGS. 1-2, FIG. 1 shows a top schematic view of a semiconductor device 20, in accordance with an example embodiment, and FIG. 2 shows an enlarged side view of semiconductor device 20 along section lines 2-2 of FIG. 1. In an example embodiment, semiconductor device 20 includes a transistor die 24 and an isolation structure 26. Transistor die 24 has a top die surface 28, a bottom die surface 30, an electrically conductive structure 32, and input and output pads 34, 36, respectively, at top die surface 28 of transistor die 24. In the illustrated example, transistor die 24 includes a base semiconductor substrate 38 and an interconnect structure 40 (which may alternatively be referred to herein as a build-up structure 40). Interconnect structure 40 may be formed of multiple layers of dielectric material and patterned electrically conductive material on and over a top surface 42 of base semiconductor substrate 38. The top surface of interconnect structure 40 defines top die surface 28 of transistor die 24. In an embodiment, an electrically conductive layer 44 is formed on a bottom surface of base semiconductor substrate 38 to define bottom die surface 30 of transistor die 24.

Conductive layer 44 may function as a ground reference node for transistor die 24. As used herein, a "ground reference node" means a conductive feature that is integrally-formed with transistor die 24, and which is configured to be electrically coupled to an external conductive feature which, in turn, may be electrically coupled to a ground reference voltage. Thus, although not shown in FIGS. 1-2, when semiconductor device 20 is ultimately packaged, conductive layer 44 may be physically and electrically coupled to a ground node of a package substrate (discussed below). In other embodiments, the "ground reference node" may be an integrally-formed conductive feature of transistor die 24 other than conductive layer 44 (e.g., the ground reference node may be a bondpad, the end(s) of one or more conductive vias, or other integrally-formed electrically conductive features).

Transistor die 24 may be a field effect transistor (FET) that includes first and second interdigitated current conducting terminals 46, 48 and control terminals 50 interposed between first and second current conducting terminals 46, 48, all of which are arranged at top surface 42 of base semiconductor substrate 38. In an example, first current conducting terminals 46 include drain fingers, second current conducting terminals 48 include source fingers, and control terminals 50 include gate fingers. Thus, first current conducting terminals 46 may alternatively be referred to herein as drain fingers 46, second current conducting terminals 48 may alternatively be referred to herein as source fingers 48, and control terminals 50 may alternatively be referred to herein as gate fingers 50. Input pad 34 (e.g., an input manifold) is electrically connected to gate fingers 50 and output pad 36 (e.g., an output manifold) is electrically connected to drain fingers 46. That is, an electrically conductive pathway is formed between input pad 34 and gate fingers 50, and another electrically conductive pathway is formed between drain fingers 46 and output pad 36.

In an example, transistor die 24 may be a metal-oxide-semiconductor FET (MOSFET), a laterally-diffused MOSFET (LDMOS FET), an enhancement-mode or depletion-mode high electron mobility transistor (HEMT), or another type of FET. According to various embodiments, drain, source, and gate fingers 46, 48, 50 may be implemented, for example, using a silicon-based FET, a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

In some configurations, base semiconductor substrate 38 may be a high-resistivity silicon substrate (e.g., a silicon substrate having bulk resistivity in a range of about 500 ohm-centimeter (cm) to about 100,000 ohm-cm or greater). Alternatively, base semiconductor substrate 38 may be a semi-insulating gallium arsenide (GaAs) substrate (e.g., a GaAs substrate having bulk resistivity up to $10^8$ ohm-cm), or another suitable high-resistivity substrate. The use of a high-resistivity substrate may enable various on-die circuitry to exhibit relatively low losses, when compared with amplifier ICs that do not utilize a high-resistivity substrate. In still other configurations, base semiconductor substrate 38 may be any of multiple variants of a silicon substrate, a silicon-germanium substrate, a gallium nitride (GaN) substrate, another type of III-V semiconductor substrate, or some other type of semiconductor substrate.

Interconnect structure 40 may include, for example, a plurality of alternating dielectric and patterned conductive layers, along with other conductive structures (e.g., conductive polysilicon structures). Within interconnect structure 40, portions of different patterned conductive layers and conductive structures are electrically coupled with conductive vias. In addition, conductive through substrate vias (TSVs) (e.g., TSV 52) may provide conductive paths between the top and bottom surfaces of base semiconductor substrate 38. The TSVs may or may not be lined with dielectric material to insulate the TSVs from the base semiconductor substrate 38.

As more clearly depicted in FIG. 2, drain fingers 46 (e.g., the first current carrying terminals), source fingers 48 (e.g., the second current carrying terminals), and gate fingers 50 (e.g., the control terminals) are arranged at top surface 42 of base semiconductor substrate 38. An active area of transistor die 24 includes elongated, parallel-aligned drain regions 54 and source regions 56, where each drain region 54 and source region 56 is a doped semiconductor region formed in base semiconductor substrate 38. A variably-conductive channel region 58 (e.g., a drain drift region) is present between adjacent source and drain regions 54, 56.

Conductive (e.g., polysilicon or metal) gate fingers 50 are formed in interconnect structure 40 over top surface 42 of base semiconductor substrate 38. Each gate finger 50 extends over and along the length of each of channel regions 58. Each gate finger 50 is electrically coupled (e.g., through conductive vias and patterned conductive layers in interconnect structure 40) at multiple points along its length to elongated, conductive gate structures and runners 60, which in turn are electrically coupled to input pad 34 (see especially the enlarged view in FIG. 1). Similarly, conductive (e.g., polysilicon or metal) drain fingers 46 are formed in interconnect structure 40 over top surface 42 of base semiconductor substrate 38. Each drain finger 46 extends over and along the length of one of drain regions 54. Drain fingers 46 are electrically coupled to output pad 36. Finally, source regions 56 are electrically coupled to conductive (polysilicon or metal) source fingers 48, which in turn are coupled to conductive TSVs 52 (referred to herein as source TSVs 52) that extend through base semiconductor substrate 38 to connect with electrically conductive layer 44 on the bottom surface of base semiconductor substrate 38. In operation, voltages applied to gate fingers 50 by way of gate runners 60 modulate the conductivity of variably-conductive channel regions 58, thus enabling current flow between source and drain regions 56, 54 (or ultimately between conductive layer 44 and each drain finger 46).

In an example embodiment, electrically conductive structure 30 includes at least one electrically conductive via 62 formed in interconnect structure 40. Electrically conductive via 62 may be electrically connected to one of source fingers 48. Additionally, or alternatively, conductive via 62 formed in interconnect structure 40 may be electrically connected to source TSV 52 extending through base semiconductor substrate 38 to conductive layer 44 of transistor die 24. Thus, conductive structure 32 of transistor die 24 collectively includes conductive via 62 and source TSV 52 which may form a common return path (e.g., a ground reference voltage path) in transistor die 24 to conductive layer 44 at bottom die surface 30 of transistor die 24. In the illustrated example, a top surface 64 of conductive via 62 is exposed from interconnect structure 40. That is, any dielectric material of interconnect structure 40 that may have been formerly overlying top surface 64 of conductive via 62 is absent.

In an embodiment, isolation structure 26 includes a bondwire 66 directly coupled to top surface 64 of conductive via 62. By way of example, bondwire 66 includes a first end 68, a second end 70, and an intermediate region 72 between the first and second ends 68, 70. Intermediate region 72 of bondwire 66 is directly coupled to top surface 64 of conductive via 62. Thus, top surface 64 defines a bond site or source pad for bondwire 66. Bondwire 66 may be coupled to top surface 64 using a suitable wire bonding technique. In one embodiment, bondwire 66 may be gold wire with a small diameter, such as 1.3 mil, and a ball bond technique may be implemented to minimize the required bond pad size (e.g., to minimize the size of top surface 64). Additionally, a ball bonding technique typically imposes less pressure on the structure than other wire bonding techniques, thereby effectively decreasing the potential for damaging transistor die 24 during fabrication. In some embodiments, first and second ends 68, 70 of bondwire 66 may be directly coupled to a surrounding package substrate 74 (generally represented by a box surrounding transistor die 24 in FIG. 1) near or proximate to a perimeter 76 of transistor die 24. As used herein, the term "package substrate" refers to an electrically conductive substrate, ground plane, flange, or any other electrically conductive structure that enables a connection to a common return path (e.g., ground). First and second ends 68, 70 may also be coupled to package substrate 74 utilizing a ball bond technique.

In FIG. 1, black circles along bondwire 66 of isolation structure 26 represent ball bonds formed at bond sites and in FIG. 2, a black flattened black half-circle represents a ball bond formed at one bond site at top surface 64. Thus, the illustrated example includes two bond sites 78, 80 on package substrate 74 and multiple bond sites 82A, 82B, 82C (e.g., three) over source regions 56 of transistor die 24. In the illustrated configuration, since source fingers 48 at source regions 56 are electrically connected to source TSV's 52 extending through base semiconductor substrate 38, these source fingers 48 can effectively be elevated by forming conductive vias 62 in the build-up structure (e.g., interconnect structure 40) and by exposing top surfaces 64 of conductive vias 62. Top surfaces 64 of conductive vias 62 thus serve as ground bond pads for grounded landing of bondwire 66 without increasing the overall die size of transistor die 24.

Alternative embodiments may include more than or less than the illustrated bond sites 78, 80, 82. For example, bondwire 66 may only be bonded to the surrounding package substrate 74, without attachment to bond sites over source regions 56. In another example, bondwire 66 may only be bonded to bond sites over source regions, without attachment to the surrounding package substrate 74. In yet another example, bondwire 66 may not be electrically coupled to one of source TSVs 52, but may instead be coupled to a "dummy" pad (serving as a conductive structure at top die surface 28) that is not grounded through a source TSV 52. That is, in a configuration in which bondwire 66 is only bonded to the surrounding package substrate, the points of bondwire 66 that are coupled to top die surface 28 at, for example, the "dummy" pads, need not be grounded through transistor die 24.

In a system configuration, input interconnects 84 (one partially shown in FIG. 1) are coupled to input pad 34 at first attachment sites 86 (one shown in FIG. 1). Similarly, in the system configuration, output interconnects 88 (one partially shown in FIG. 1) are coupled to output pad 36 at second attachment sites 90 (one shown in FIG. 1). Input and output interconnects 84, 86 may be laterally displaced from one another (e.g., be spaced apart from one another) but located close to one another. In some embodiments, a third attachment site (e.g., bond site 82B) may be positioned between first and second attachment sites 86, 90. Strategic placement of bond sites 82 at locations of the greatest mutual coupling (e.g., between input and output interconnects 84, 86) may yield enhanced signal isolation between the inputs and outputs of transistor die 24 to thereby improve gain without impairing other performance characteristics of semiconductor device 20. A single input interconnect 84 and a single output interconnect 88 are shown for simplicity of illustration. As will be described below, semiconductor device 20 may include an array of input interconnects and another array of output interconnects.

Figure 3:
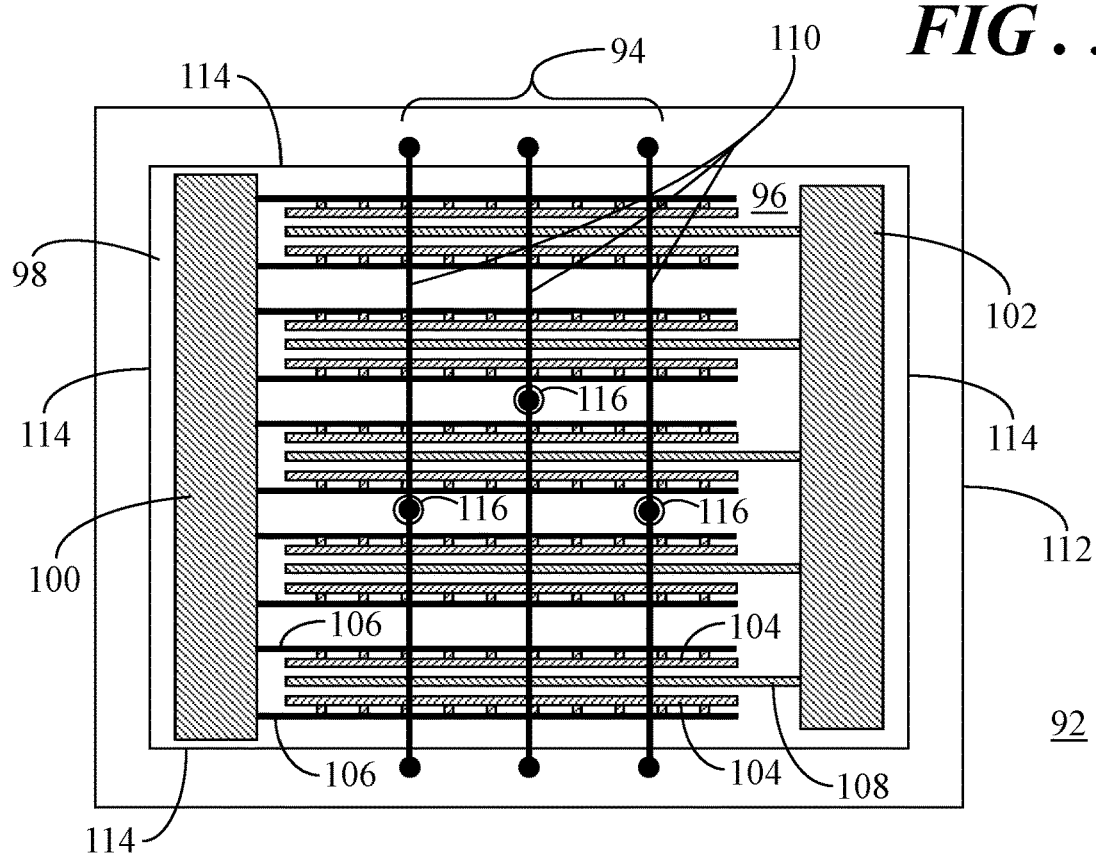
FIG. 3 shows a top schematic view of a semiconductor device with an isolation structure, in accordance with another example embodiment.

FIG. 3 shows a top schematic view of a semiconductor device 92 with an isolation structure 94, in accordance with another example embodiment. Isolation structure 94 extends above a top die surface 96 of a transistor die 98. Transistor die 98 includes an input pad 100 and an output pad 102. Electrically conductive structures (not visible), such as conductive structure 32 (FIG. 2) described above, are located at top die surface 96. Transistor die 98 further includes gate fingers 104 electrically coupled to input pad 100 by way of gate runners 106 and drain fingers 108 electrically coupled to output pad 102.

In an embodiment, isolation structure 94 includes a plurality of bondwires 110 extending substantially parallel to one another. Each of bondwires 110 may be directly coupled to a surrounding package substrate 112 (generally represented by a box surrounding transistor die 98) near or proximate to a perimeter 114 of transistor die 98. Alternatively or additionally, each of bondwires 110 may be electrically coupled to a conductive structure (e.g., a source pad 116) overlying source regions (not visible) of transistor die 98. In the example embodiment of FIG. 3, black circles along each of bondwires 110 on top die surface 96 of transistor die 98 represent ball bonds, and the circles surrounding the ball bonds represent source pads 116 of transistor die 98. Further, opposing ends of each of bondwires 110 are attached to the surrounding package substrate 112 in the illustrated configuration. The multiple bondwire configuration of isolation structure 94 may yield more significant signal isolation between the inputs and outputs of transistor die 98 than, for example, a single bondwire configuration.

Figure 4:
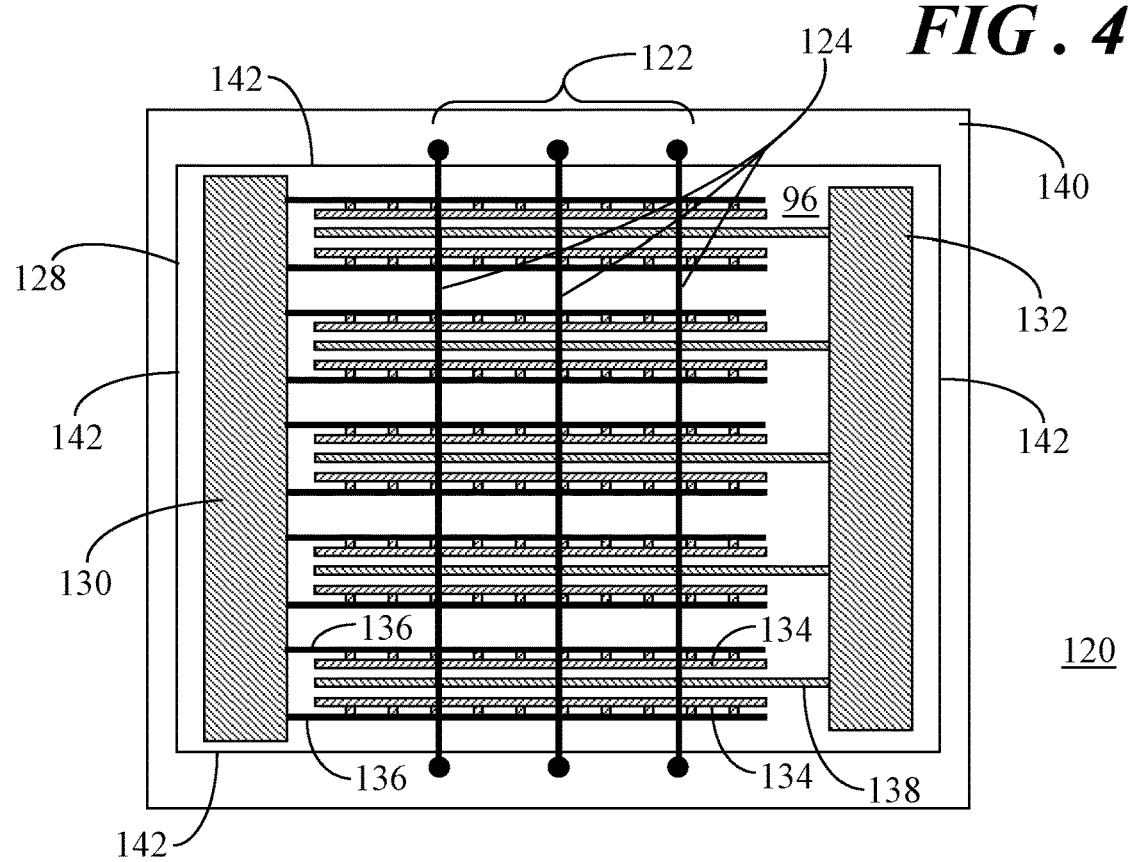
FIG. 4 shows a top schematic view of a semiconductor device with an isolation structure, in accordance with another example embodiment.

FIG. 4 shows a top schematic view of a semiconductor device 120 with an isolation structure 122, in accordance with another example embodiment. Isolation structure 122 includes a plurality of bondwires 124 extending above a top die surface 126 of a transistor die 128. Transistor die 128 includes an input pad 130 and an output pad 132. Transistor die 128 further includes gate fingers 134 electrically coupled to input pad 130 by way of gate runners 136 and drain fingers 138 electrically coupled to output pad 132.

Bondwires 124 extend substantially parallel to one another, and each of bondwires 124 is directly coupled to a surrounding package substrate 140 (generally represented by a box surrounding transistor die 128) near or proximate to a perimeter 142 of transistor die 128. However, bondwires 124 are not coupled to transistor die 128 in the illustrated embodiment. Accordingly, the multiple bondwire configuration of isolation structure 122 may yield effective signal isolation between the inputs and outputs of transistor die 128 for smaller periphery transistor configurations.

Figure 5:
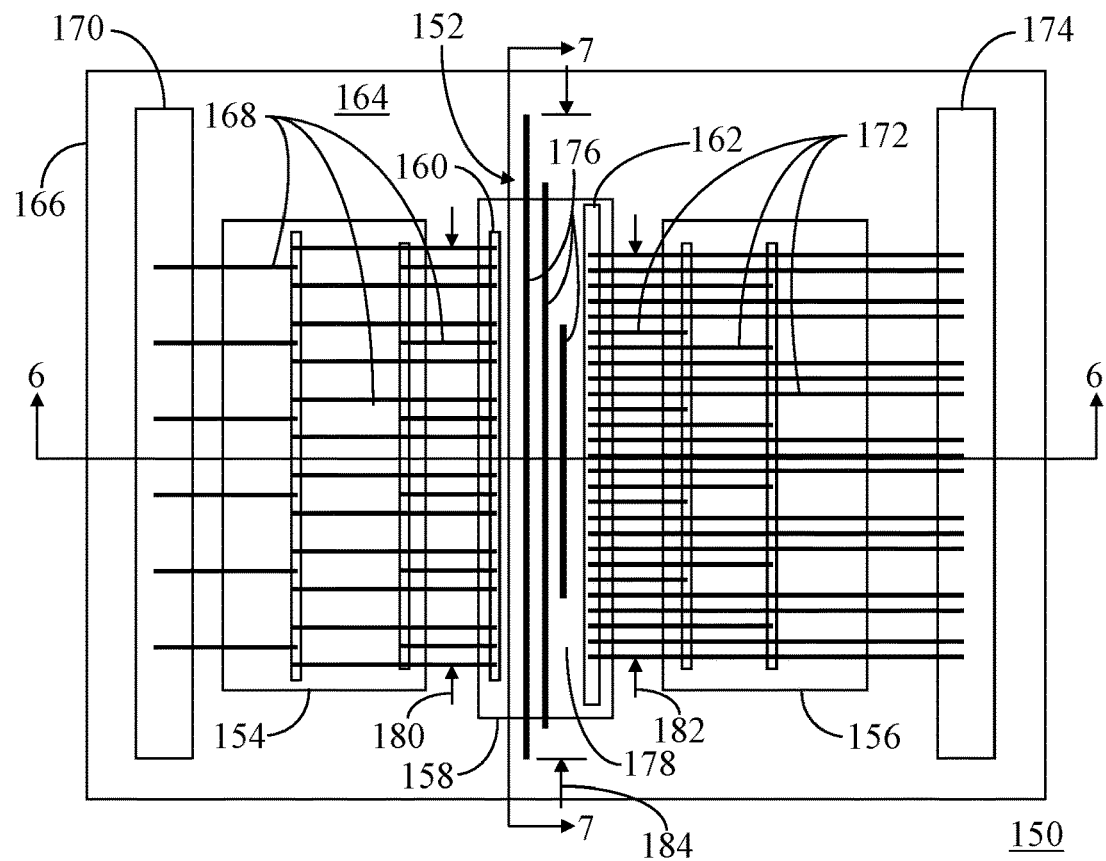
FIG. 5 shows a top schematic view of a semiconductor device with an isolation structure, in accordance with another example embodiment.
Figure 6:
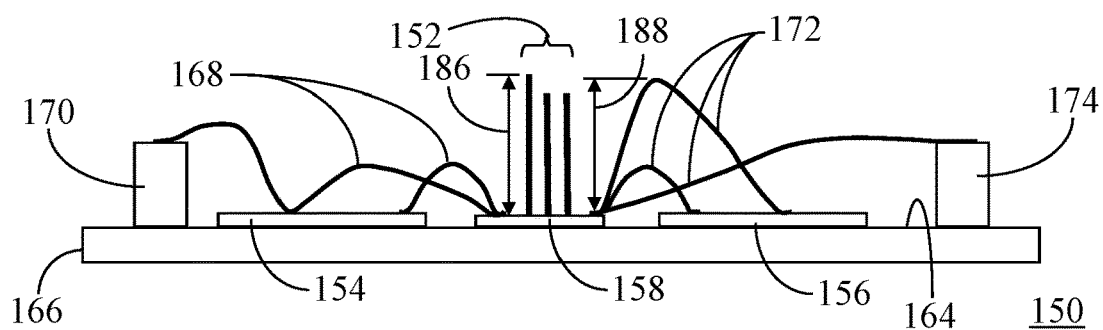
FIG. 6 shows a side view of the semiconductor device along section lines 6-6 of FIG. 5.
Figure 7:
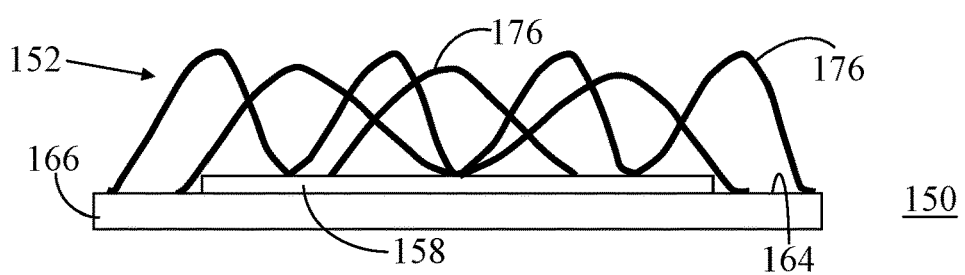
FIG. 7 shows a side view of the semiconductor device along section lines 7-7 of FIG. 5.

Referring now to FIGS. 5-7, FIG. 5 shows a top schematic view of a semiconductor device 150 with an isolation structure 152, in accordance with another example embodiment. FIG. 6 shows a side view of semiconductor device 150 along section lines 6-6 of FIG. 5, and FIG. 7 shows a side view of semiconductor device 150 along section lines 7-7 of FIG. 5. Semiconductor device 150 includes a number of integrated active and/or passive electrical components 154, 156 and a transistor die 158 having an input pad 160 and an output pad 162 manufactured on and/or subsequently mounted to a surface 164 of a package substrate, such as a ground plane 166.

Semiconductor device 150 further includes a first array of interconnects 168 (sometimes referred to as bondwires) suitably coupling an input 170 of semiconductor device 150 to component 154 and/or to input pad 160 of transistor die 158. Similarly, semiconductor device 150 further includes a second array of interconnects 172 (sometimes referred to as bondwires) suitably coupling an output 174 of semiconductor device 150 to component 156 and/or to output pad 162 of transistor die 158. Transistor die 158 may be similar to transistor die 24 (FIGS. 1-2) having one or more conductive structures 32 (FIG. 2), multiple drain, source, and gate fingers, 46, 48, 50), and so forth.

In the illustrated embodiment, isolation structure 152 includes a plurality of bondwires 176 extending substantially parallel to one another. Bondwires 176 may be attached to package substrate 166 (discussed above). Alternatively or additionally, bondwires 176 may be attached to conductive structures on a top die surface 178 of transistor die 158 (also discussed above). Collectively, first array of interconnects 168 spans a first distance 180 and second array of interconnects 172 spans a second distance 182. In an embodiment, isolation structure 152 extends a third distance 184 that is no less than either of first and second distances. In the side sectional view of FIG. 6, it can be observed that bondwires 176 of isolation structure 152 extend to a first height 186 that the same or greater than a second height 188 of first and second arrays of interconnects 168, 172. In the side sectional view of FIG. 7, it can be observed that bondwires 176 can be attached to ground plane 166 and/or to conductive structures at top die surface 178 of transistor die 158. Further, it can be observed that bond sites for the multiple bondwires 176 on top die surface 178 may be laterally staggered (i.e., the bond sites are offset from one another). Thus, bondwires 176 of isolation structure 152 form a "bondwire fence" between first and second arrays of interconnects 168, 172 that is the same or greater length than the span of arrays 168, 172 and that is the same or greater height than the maximum height of interconnects 168, 172 to yield effective signal isolation between first array of interconnects 168 and second array of interconnects 172.

Figure 8:
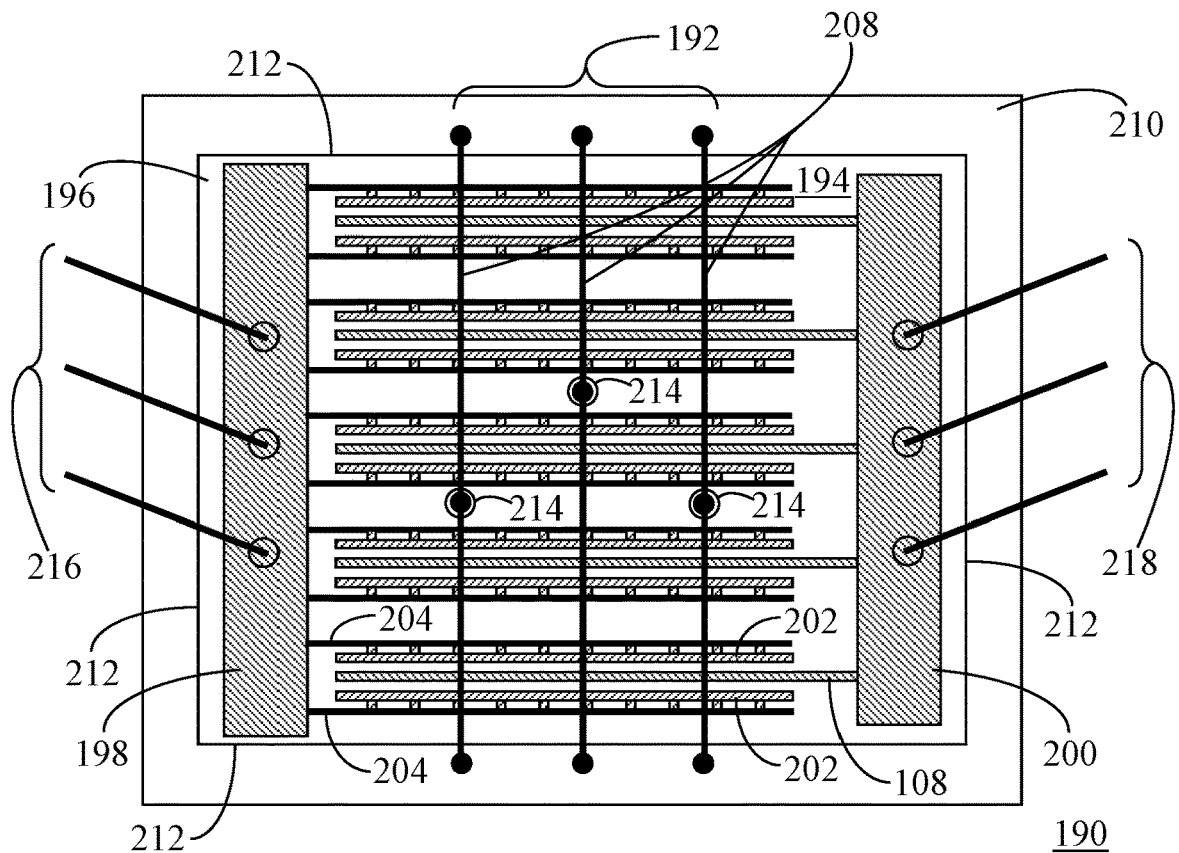
FIG. 8 shows a top schematic view of a semiconductor device with an isolation structure, in accordance with another example embodiment.

FIG. 8 shows a top schematic view of a semiconductor device 190 with an isolation structure 192 extending above a top die surface 194 of a transistor die 196, in accordance with another example embodiment. Transistor die 196 is similar to transistor die 98 (FIG. 3). Thus, transistor die 196 includes an input pad 198 and an output pad 200. Electrically conductive structures (not visible), such as conductive structure 32 (FIG. 2) described above, are located at top die surface 194. Transistor die 196 further includes gate fingers 202 electrically coupled to input pad 198 by way of gate runners 204 and drain fingers 206 electrically coupled to output pad 202.

In the illustrated example, isolation structure 192 includes a plurality of bondwires 208 extending substantially parallel to one another. Again, each of bondwires 208 may be directly coupled to a surrounding package substrate 210 (generally represented by a box surrounding transistor die 196) near or proximate to a perimeter 212 of transistor die 196. Alternatively or additionally, each of bondwires 208 may be electrically coupled to a conductive structure (e.g., a source pad 214) overlying source regions (not visible) of transistor die 196. Like the example embodiment of FIG. 3, black circles along each of bondwires 208 on top die surface 194 of transistor die 196 represent ball bonds, and the circles surrounding the ball bonds represent the elevated source pads 214 of transistor die 196. Further, opposing ends of each of bondwires 208 are attached to the surrounding package substrate 210 in the illustrated configuration.

Semiconductor device 190 further includes a first array of interconnects 216 coupled to input pad 198 of transistor die 196 and a second array of interconnects 218 coupled to output pad 200 of transistor die 196. The arrays of interconnects shown in FIGS. 5-7 (e.g., 168, 172) were oriented approximately perpendicular to the isolation structure (e.g., isolation structure 152). In accordance with the illustrated configuration of FIG. 8, first and second arrays of interconnects 216, 218 need not be arranged perpendicular to isolation structure 192. Instead, interconnects 216, 218 may be arranged such that an angle between isolation structure 192 and interconnects 216, 218 is less than ninety degrees. Such an arrangement may be useful in very small form factor semiconductor devices to accommodate particular design rules and/or other component sizes.

Figure 9:
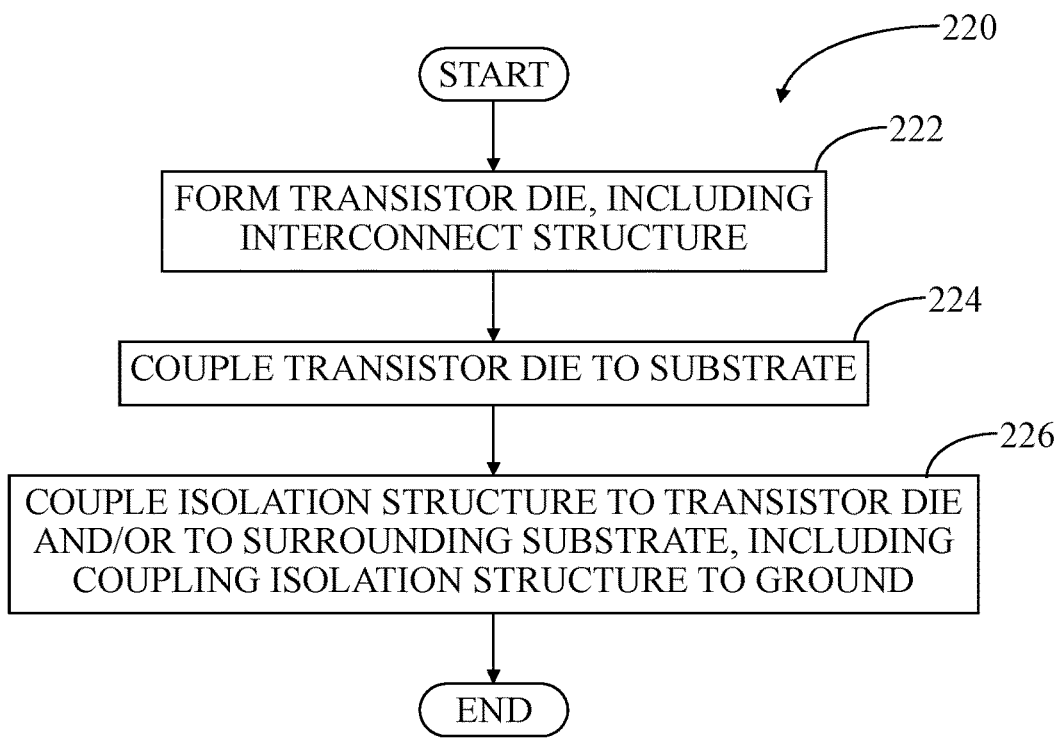
FIG. 9 shows a flowchart of a method of fabricating a semiconductor device in accordance with another example embodiment.

FIG. 9 shows a flowchart of a method 220 of fabricating a semiconductor device (e.g., semiconductor device 20, 92, 120, 150, 190, FIGS. 1-8), in accordance with another example embodiment. Fabrication method 220 may be performed to produce a semiconductor device having an isolation structure (such as those described above) between inputs and outputs of the device to effectively reduce mutual coupling between the input and output interconnects, without significantly degrading device performance.

Method 220 may begin at a block 222 by forming transistor die (e.g., 24, 98, 128, 158, 196, FIGS. 1-8) including its associated build-up structure (e.g., interconnect structure 40, FIG. 2). The transistor die includes top and bottom die surfaces, an electrically conductive structure, input and output pads formed at the top die surface as described in detail above. The transistor die may further include interdigitated first and second current conducting terminals (e.g., drain and source fingers) and control terminals (e.g., gate fingers) interposed between the first and second current conducting terminals. The input pad is electrically connected to the control terminals and the output pad is electrically connected to the first current conducting terminals. The electrically conductive structure (e.g., 32, FIG. 2) of the transistor die may include a first one of the second current conducting terminals.

Forming the build-up structure (e.g., interconnect structure 40, FIG. 2) may include forming the interconnect structure of multiple layers of dielectric material and electrically conductive material over a top surface of a base semiconductor substrate (e.g., 38, FIG. 2), including over the at least the first one of the second current conducting terminals. An electrically conductive via (e.g., via 62, FIG. 2) may be formed in the interconnect structure. The electrically conductive via may be electrically connected with the first one of the current conducting terminals (e.g., source finger 48, FIG. 2) and a top surface (e.g., 64, FIG. 2) of the via may be exposed from the interconnect structure.

At a block 224, the bottom die surface (e.g., 30, FIG. 2) of the transistor die (e.g., 24, 98, 128, 158, 196, FIGS. 1-8) may be coupled to an electrically conductive device substrate (e.g., package substrate 74, 112, 140, 166, 210, FIGS. 1, 3, 4, 5, 8). Additional active and passive components of the semiconductor device may additionally be coupled to the device substrate, such as those shown in FIGS. 5-7.

At a block 226, an isolation structure (e.g., 26, 94, 122, 152, 192, FIGS. 1-8) may be coupled to the electrically conductive structure (e.g., 32, FIG. 2) at the top die surface of the transistor die such that the isolation structure is interposed between the input and output pads of the transistor die, and the isolation structure extends above the top die surface of the transistor die. Coupling the isolation structure may entail the attachment of one or a plurality of bondwires of the isolation structure to at least one of the device substrate and the top surface (64, FIG. 2) of the electrically conductive via (e.g., 62, FIG. 2) utilizing a ball bonding process. The plurality of bondwires may be oriented substantially parallel to one another to form the isolation structure.

Additional components may be coupled to the package substrate and arrays of interconnects may be formed between the various passive and active components of the system and the transistor die, as discussed above. Additionally, the semiconductor device may be packaged in an overmolded or air-cavity package. Thereafter, fabrication method 220 may end.

Figure 10:
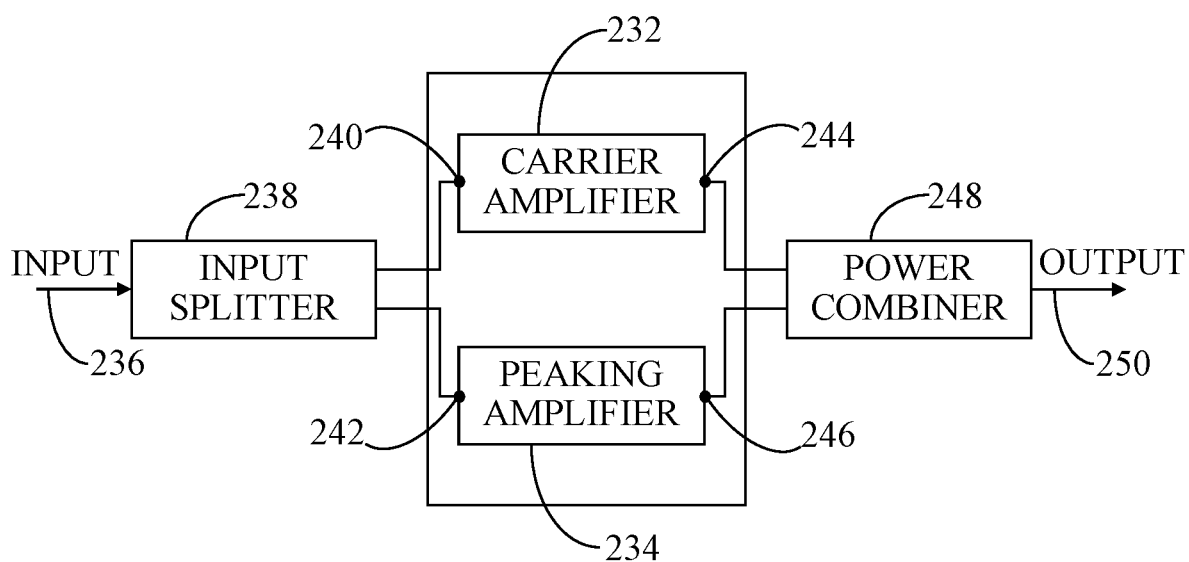
FIG. 10 shows a simplified block diagram of a Doherty power amplifier.

Referring now to FIG. 10, FIG. 10 shows a simplified block diagram of a Doherty power amplifier 230. Doherty power amplifier 230 includes a first circuit in the form of a carrier amplifier 232 and a second circuit in the form of a peaking amplifier 234. An input signal 236 is split into two signals by an input splitter 238, which may apply a phase delay to one of the signals (e.g., a 90 degree phase delay). One of the resulting input signals is applied to a first input 240 of carrier amplifier 232, and the other input signal is applied to a second input 242 of peaking amplifier 234. Carrier amplifier 232 produces a first output signal at a first output 244 and peaking amplifier 234 produces a second output signal at a second output 246. In a Doherty configuration, first input 240 and first output 244 may constitute a gate terminal and a drain terminal of carrier amplifier 232, respectively. Similarly, second input 242 and second output 246 may constitute a gate terminal and a drain terminal of peaking amplifier 234, respectively. The first and second output signals are combined through a power combiner 248 to produce a combined output signal 250. Those skilled in the art will recognize that a Doherty power amplifier semiconductor package typically includes additional electronic devices and circuitry not shown herein for simplicity of illustration.

Carrier amplifier 232 may be configured to be active for an entire range of output powers of Doherty power amplifier 230. Peaking amplifier 234 may be configured to turn on only when carrier amplifier 232 saturates. Peaking amplifier 234 may deliver current as carrier amplifier 232 saturates, thereby reducing the impedance seen at the output of carrier amplifier 232. Thus, carrier amplifier 232 delivers more current to the load while carrier amplifier 232 is saturated because of a "load-pulling" effect. Since carrier amplifier 232 remains close to saturation, Doherty power amplifier 230 is able to transmit peak output power so that the total efficiency of the system remains relatively high.

Power combiner 248, operating to combine the first output signal from carrier amplifier 232 with the second output signal from peaking amplifier 234, may include a quarter-wave impedance inverter. The quarter-wave impedance inverter can add a ninety degree lag to the output signal from carrier amplifier 232 or peaking amplifier 234 in order to compensate for the phase delay added by the input splitter to the signal provided to either peaking amplifier 234 or carrier amplifier 232. The phase of the signal provided to peaking amplifier 234 is typically designed to lag that of carrier amplifier 232 by ninety degrees so that the two output signals add in-phase when the output signals are combined at the output of power combiner 248 to form combined output signal 250.

In the exemplary circuit in FIG. 10, each of carrier amplifier 232 and peaking amplifier 234 may include a number of active and passive electrical elements. For example, carrier amplifier 232 may include a first capacitor that couples first input 240 to a first transistor, which applies the appropriate amplification to the first input signal received at first input 240. An output of the first transistor can be connected to a second capacitor. The first and second capacitors operate to condition the first input signal that is amplified by the first transistor. Similarly, peaking amplifier 234 can include a third capacitor coupling second input 242 to a second transistor, which applies the appropriate amplification to the second input signal received at second input 242. An output of the second transistor can be connected to a fourth capacitor. The third and fourth capacitors operate to condition the input second signal that is amplified by the second transistor. Those skilled in the art will recognize that carrier amplifier 232 and peaking amplifier 234 may include additional integrated active and/or passive electronic components not shown herein for simplicity of illustration.

Figure 11:
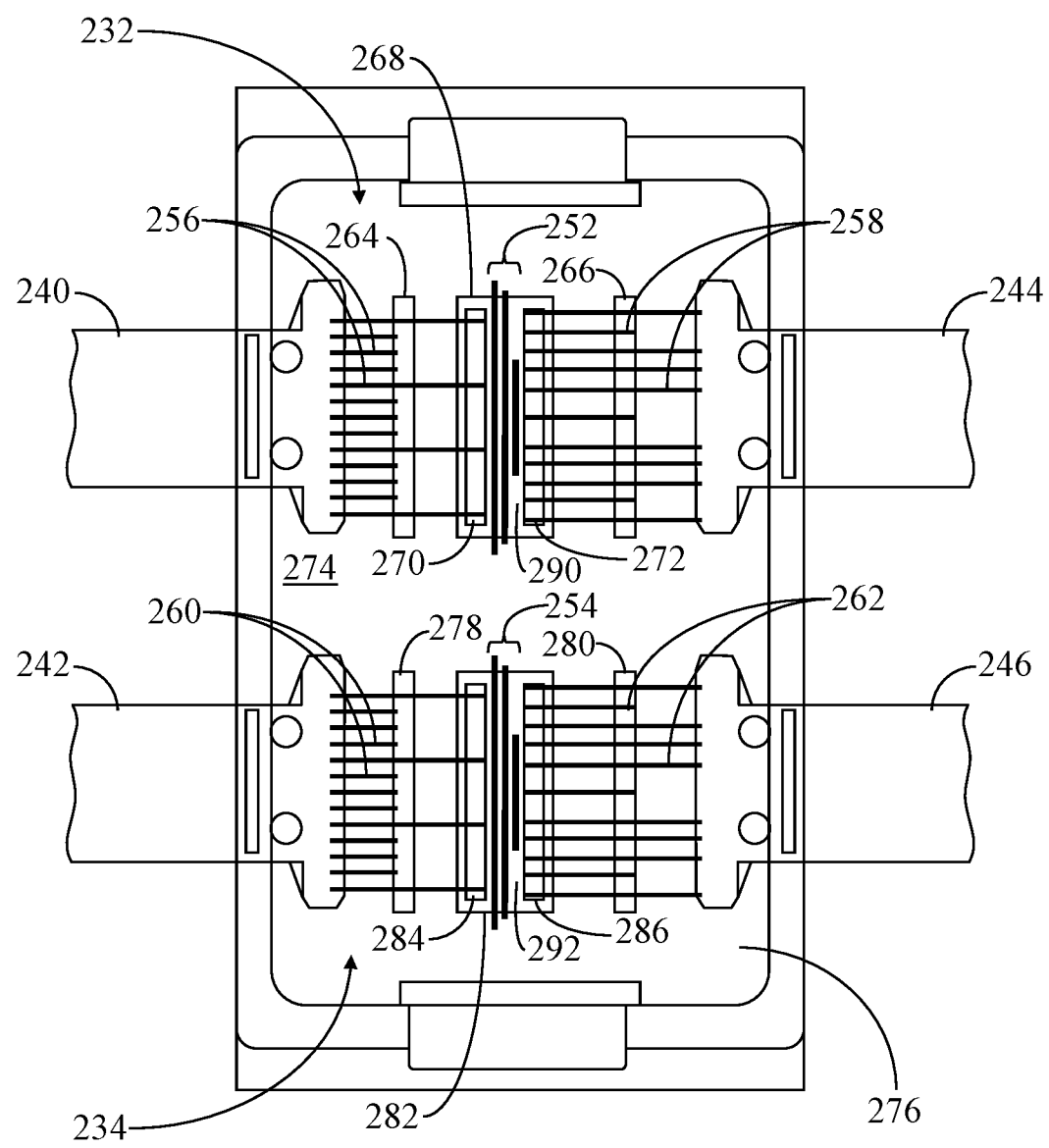
FIG. 11 shows a top schematic view of components of the Doherty power amplifier of FIG. 10 with an isolation structure, in accordance with another example embodiment.

FIG. 11 shows a top schematic view of components of carrier and peaking amplifiers 232, 234 of Doherty power amplifier 230 with isolation structures 252, 254, in accordance with another example embodiment. The separate electrical devices making up carrier amplifier 232 and peaking amplifier 234 are connected to one another using multiple arrays of interconnects 256, 258, 260, 262, sometimes referred to as bond wires. In a practical application, the input signal paths (e.g., between inputs, capacitors and transistors) of carrier amplifier 232 may be established using a first array of interconnects 256 and the output signal paths (between outputs, capacitors, and transistors) of carrier amplifier 232 may be established using a second array of interconnects 258. Similarly, the input signal paths (e.g., between inputs, capacitors and transistors) of peaking amplifier 234 may be established using a third array of interconnects 260 and the output signal paths (between outputs, capacitors, and transistors) of peaking amplifier 234 may be established using a fourth array of interconnects 262.

Carrier amplifier 232 includes a number of integrated active and/or passive electrical components, such as capacitors 264, 266 and a transistor die 268 (having a gate input pad 270 and a drain output pad 272) manufactured on and/or subsequently mounted to a surface 274 of a single, package substrate, such as a package ground plane 276. Capacitors 264, 266 may be, for example, Metal-Oxide-Semiconductor (MOS) capacitors mounted on ground plane 276. Similarly, peaking amplifier 234 includes a number of electrical devices, such as capacitors 278, 280 and a transistor die 282 (having a gate input pad 284 and a drain output pad 286) manufactured on or subsequently mounted to surface 274 of package ground plane 276. Capacitors 278, 280 may be, for example, MOS capacitors mounted on ground plane 276.

The layout of the depicted Doherty power amplifier 230 can result in mutual coupling between the input wires, e.g., first array of interconnects 256, and the output wires, e.g., second array of interconnects 258, of carrier amplifier 232. Similarly, mutual coupling may occur between the input wires, e.g., third array of interconnects 260, and the output wires, e.g., fourth array of interconnects 262, of peaking amplifier 234. The mutual coupling between the first and second arrays of interconnects 256, 258 of carrier amplifier 232 and between the third and fourth arrays of interconnects 260, 262 of peaking amplifier 234 can effectively lower the gain of each of the carrier and peaking amplifiers 232, 234.

Therefore, Doherty power amplifier 230 includes isolation structure 252 interposed between gate input pad 270 and drain output pad 272 of carrier amplifier 232 to reduce the mutual coupling between first and second arrays of interconnects 256, 258. Likewise, Doherty power amplifier 230 includes isolation structure 254 interposed between gate input pad 284 and drain output pad 286 of peaking amplifier 234 to reduce the mutual coupling between third and fourth arrays of interconnects 260, 262. Isolation structures 252, 254 may be similar to those described above. That is, each of isolation structures 252, 254 may include one or a plurality of bondwires extending substantially parallel to one another, where each of the bondwires is attached to at least one of the package substrate (e.g., package ground plane 276) and electrically conductive structures formed on top die surfaces 290, 292 of respective transistor dies 268, 282. Isolation structures 252, 254 may operate as shields or fences to interrupt and prevent the mutual coupling between the corresponding input and output bondwires (e.g., interconnects) and thereby improve performance of Doherty power amplifier 230.

The isolation structures described above may be implemented with a variety of transistor die configurations that have multiple interdigitated drain and gate fingers. Alternatively, the isolation structures may be adapted for use with a single input/single output transistor die to reduce mutual coupling between the input and output. Additionally, although embodiments have been described herein with respect to a Doherty power amplifier with one carrier amplifier and one peaking amplifier, those of skill in the art would understand, based on the description herein, that embodiments of the inventive subject matter may be used in conjunction with virtually any type of single or multiple path amplifier. Accordingly, the various embodiments are not limited to use with Doherty amplifiers, nor are they limited to use with amplifiers having only two amplification paths. For example, an alternate embodiment may include a device with only one amplification path, or a device with three or more amplification paths, and isolation structures interposed between the inputs and outputs.

Accordingly, a semiconductor device incorporates an isolation structure to reduce mutual coupling between inputs and outputs of the semiconductor device. The isolation structure can take the form of one or a plurality of bondwires interposed between the input pads and the output pads of a transistor die of the semiconductor device. The bondwires are connected to a common return path (e.g., ground) of the transistor die. The bondwires may be coupled to a conductive structure extending through the transistor die and/or to a flange or system substrate of the semiconductor device. Such a configuration may yield significant signal isolation between the inputs and outputs of the transistor die to thereby improve gain without impairing other performance characteristics of the semiconductor device, especially at higher frequencies.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A semiconductor device comprising:
a transistor die having a top die surface and a bottom die surface, an electrically conductive structure, and input and output pads formed at the top die surface, the transistor die further comprising interdigitated first and second current conducting terminals, and control terminals interposed between the first and second current conducting terminals, wherein the input pad is electrically connected to the control terminals, the output pad is electrically connected to the first current conducting terminals, and the conductive structure includes a first one of the second current conducting terminals; and
an isolation structure interposed between the input and output pads of the transistor die, the isolation structure extending above the top die surface of the transistor die, the isolation structure being coupled to the conductive structure, and the isolation structure being connected to a common return path of the transistor die.

2. The semiconductor device of claim 1 further comprising an electrically conductive substrate, the bottom die surface of the transistor die is coupled to the electrically conductive substrate, and the first one of the second current conducting terminals is electrically coupled to the substrate to enable connection of the isolation structure to the common return path.

3. The semiconductor device of claim 1 wherein:
the transistor die further comprises an interconnect structure formed over the first one of the second current conducting terminals at the top die surface, the interconnect structure being formed of multiple layers of dielectric material and electrically conductive material; and
the conductive structure further includes at least one conductive via formed in the interconnect structure and electrically connected with the first one of the second current conducting terminals, a top surface of the at least one conductive via being exposed from the interconnect structure, and the isolation structure being attached to the top surface to couple the isolation structure to the first one of the second current conducting terminals.

4. The semiconductor device of claim 1 wherein:
the first current conducting terminals include drain fingers;
the second current conducting terminals include source fingers; and
the control terminals include gate fingers interposed between the source and drain fingers.

5. The semiconductor device of claim 1 further comprising:
a first interconnect coupled to the input pad of the transistor die at a first attachment site; and
a second interconnect coupled to the output pad of the transistor die at a second attachment site, the first and second attachment sites being laterally displaced from one another, wherein a third attachment site of the isolation structure to the conductive structure is positioned between the first and second attachment sites.

6. The semiconductor device of claim 1 wherein the isolation structure comprises a bondwire.

7. The semiconductor device of claim 6 wherein the bondwire is directly coupled to the conductive structure at a bond site on the conductive structure.

8. The semiconductor device of claim 6 wherein:
the bondwire has a first end, a second end, and an intermediate region between the first and second ends, wherein the intermediate region is directly coupled to a bond site on the conductive structure; and
the semiconductor device further comprises an electrically conductive substrate, the bottom die surface of the transistor die being coupled to the substrate, wherein the first and second ends of the bond wire are coupled to the substrate proximate an outer perimeter of the transistor die.

9. A semiconductor device comprising:
a transistor die having a top die surface and a bottom die surface, an electrically conductive structure, and input and output pads formed at the top die surface;
an isolation structure interposed between the input and output pads of the transistor die, the isolation structure extending above the top die surface of the transistor die, the isolation structure being coupled to the conductive structure, and the isolation structure being connected to a common return path of the transistor die;
a first array of interconnects coupled to the input pad of the transistor die, the first array of interconnects spanning a first distance; and
a second array of interconnects coupled to the output pad of the transistor die, the second array of interconnects spanning a second distance, wherein the isolation structure extends a third distance that is no less than either of the first and second distances.

10. A semiconductor device comprising:
a transistor die having a top die surface and a bottom die surface, an electrically conductive structure, and input and output pads formed at the top die surface; and
an isolation structure interposed between the input and output pads of the transistor die, the isolation structure extending above the top die surface of the transistor die, the isolation structure being coupled to the conductive structure, and the isolation structure being connected to a common return path of the transistor die, wherein the isolation structure comprises a plurality of bondwires extending substantially parallel to one another.

11. A semiconductor device comprising:
an electrically conductive substrate;
an input device;
an output device;
a transistor die interposed between the input and output devices, the transistor die having a top die surface and a bottom die surface, the bottom die surface being coupled to the electrically conductive substrate, a conductive structure, input and output pads formed at the top die surface, and a plurality of electrically conductive structures formed on the top die surface;
a first interconnect coupling the input pad of the transistor die with the input device;
a second interconnect coupling the output pad of the transistor die with the output device; and an isolation structure interposed between the input and output pads of the transistor die, the isolation structure comprising a plurality of bondwires extending above the top die surface of the transistor die, and the bondwires extending substantially parallel to one another, wherein each of the bondwires is attached to at least one of the substrate and the plurality of electrically conductive structures.

12. The semiconductor device of claim 11 wherein the bondwire has a first end, a second end, and an intermediate region between the first and second ends, wherein the intermediate region is directly coupled to a bond site on conductive structure, and the first and second ends of the bond wire are coupled to the substrate proximate an outer perimeter of the transistor die.

13. A semiconductor device comprising:
an electrically conductive substrate;
an input device;
an output device;
a transistor die interposed between the input and output devices, the transistor die having a top die surface and a bottom die surface, the bottom die surface being coupled to the electrically conductive substrate, a conductive structure, input and output pads formed at the top die surface, interdigitated first and second current conducting terminals, and control terminals interposed between the first and second current conducting terminals, wherein the input pad is electrically connected to the control terminals, the output pad is electrically connected to the first current conducting terminals, the conductive structure includes a first one of the second current conducting terminals;
a first interconnect coupling the input pad of the transistor die with the input device;
a second interconnect coupling the output pad of the transistor die with the output device; and
an isolation structure interposed between the input and output pads of the transistor die, the isolation structure comprising at least one bondwire, the bondwire extending above the top die surface of the transistor die, the bondwire being coupled to the conductive structure, and the bondwire being connected to a common return path of the transistor die, wherein the first one of the second current conducting terminals of the conductive structure is electrically coupled to the substrate to enable the connection of the bondwire to the common return path of the transistor die.

14. The semiconductor device of claim 13 wherein:
the transistor die further comprises an interconnect structure formed over the first one of the second current conducting terminals at the top die surface, the interconnect structure being formed of multiple layers of dielectric material and electrically conductive material; and
the conductive structure further includes at least one conductive via formed in the interconnect structure and electrically connected with the first one of the second current conducting terminals, wherein a top surface of the at least one conductive via is exposed from the interconnect structure, and the bondwire is attached to the top surface to couple the isolation structure to the first one of the second current conducting terminals.

15. A method of fabricating a semiconductor device comprising:
coupling a bottom die surface of a transistor die to an electrically conductive device substrate, wherein the transistor die includes a top die surface and a bottom die surface, an electrically conductive structure, input and output pads formed at the top die surface, interdigitated first and second current conducting terminals, and control terminals interposed between the first and second current conducting terminals, and wherein the input pad is electrically connected to the control terminals, the output pad is electrically connected to the first current conducting terminals, and the conductive structure includes a first one of the second current conducting terminals
forming an interconnect structure over at least the first one of the second current conducting terminals, the interconnect structure being formed of multiple layers of dielectric material and electrically conductive material, the forming the interconnect structure including:
forming at least one electrically conductive via in the interconnect structure;
electrically connecting the at least one electrically conductive via with the first one of the second current conducting terminals; and
exposing a top surface of the at least one conductive via from the interconnect structure; and
coupling an isolation structure to the electrically conductive structure such that the isolation structure is interposed between the input and output pads of the transistor die, and the isolation structure extends above the top die surface of the transistor die, wherein the coupling the isolation structure includes attaching a bondwire of the isolation structure to the top surface of the at least one conductive via; and
connecting the isolation structure to a common return path of the transistor die.

16. The method of claim 15 wherein the attaching the bondwire comprises utilizing a ball bonding process to attach the bondwire to the top surface of the at least one conductive via.

17. A method of fabricating a semiconductor device comprising:
coupling a bottom die surface of a transistor die to an electrically conductive device substrate, wherein the transistor die includes a top die surface and a bottom die surface, input and output pads formed at the top die surface, and a plurality of electrically conductive structures formed on the top die surface;
coupling an isolation structure to the electrically conductive structure such that the isolation structure is interposed between the input and output pads of the transistor die, and the isolation structure extends above the top die surface of the transistor die, wherein the coupling the isolation structure comprises utilizing a plurality of bondwires oriented substantially parallel to one another to form the isolation structure, wherein each of the bondwires is attached to at least one of the substrate and the plurality of electrically conductive structures; and
connecting the isolation structure to a common return path of the transistor die.

* * * * *